United States Patent [19]
Brannen et al.

[11] Patent Number: 5,312,245
[45] Date of Patent: May 17, 1994

[54] PARTICULATE TRAP FOR VERTICAL FURNACE

[75] Inventors: James P. Brannen; Richard R. Hansotte, Jr., both of Richmond; Dieter K. Neff, Cambridge, all of Vt.

[73] Assignee: International Business Machines Corporation, Armonk, N.Y.

[21] Appl. No.: 93,542

[22] Filed: Jul. 16, 1993

[51] Int. Cl.⁵ .................... F27B 15/00; F27D 3/00
[52] U.S. Cl. ........................ 432/95; 432/241; 432/152
[58] Field of Search ............. 432/222, 95, 96, 152, 432/241

[56] References Cited

U.S. PATENT DOCUMENTS

| | | | |
|---|---|---|---|
| 3,841,828 | 10/1974 | Cooper | 432/222 |
| 4,007,014 | 2/1977 | Matsumoto et al. | 432/95 |
| 4,223,048 | 9/1980 | Engle, Jr. | 427/39 |
| 4,323,366 | 4/1982 | Staudinger | 432/95 |
| 4,845,334 | 7/1989 | Stocks et al. | 219/121.59 |
| 5,000,682 | 2/1991 | Philipossian | 432/241 |

Primary Examiner—Henry C. Yuen
Attorney, Agent, or Firm—Heslin & Rothenberg

[57] ABSTRACT

A contaminant trap for a high temperature, vertical furnace of the type used in semiconductor fabrication processing. The trap is designed to reduce particulate deposition within the process chamber, thereby decreasing the likelihood of by-product contamination of the wafers. The trap includes a housing having at least one sidewall, a bottom wall and a top wall which together define an inner compartment. The housing is attached to the exhaust port of the process chamber such that exhaust by-products in the process chamber may not be evacuated through the exhaust port around the housing. The housing has an input opening in the sidewall through which exhaust by-products pass from the process chamber into the inner compartment. An output opening extends through the sidewall near the top wall through which exhaust by-products are subsequently removed from the interior compartment of the housing. When the housing is attached to the exhaust port, the bottom wall of the housing collects particulate resulting from deposition of exhaust by-products within the interior compartment of the housing, thereby preventing the collected particulate from becoming contaminant within the process chamber.

20 Claims, 3 Drawing Sheets

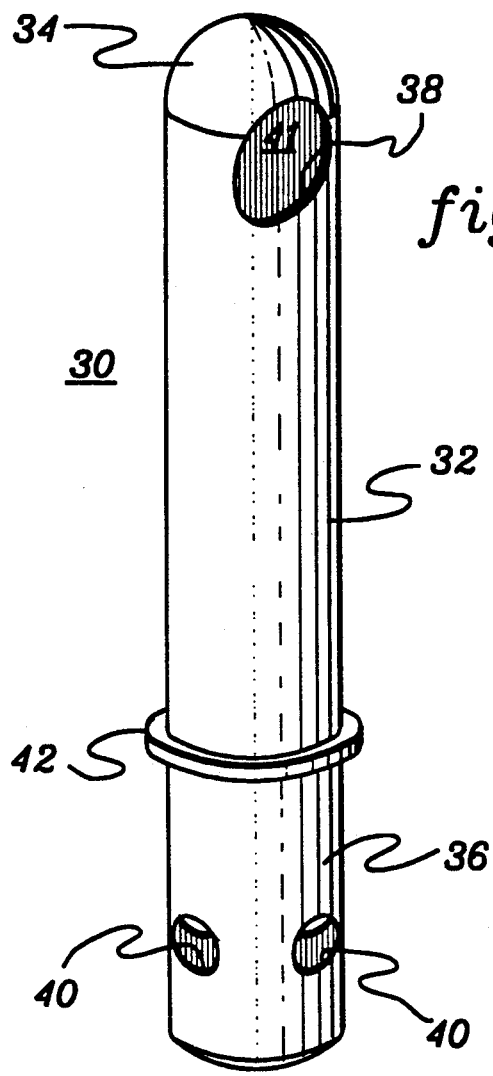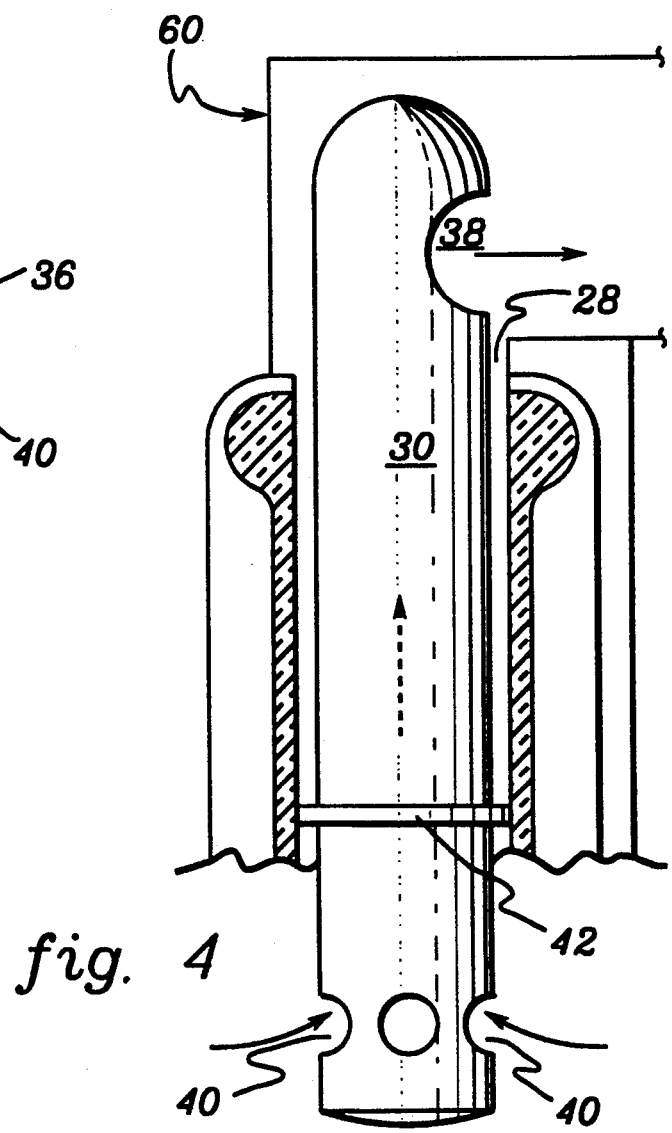

5,312,245

PARTICULATE TRAP FOR VERTICAL FURNACE

TECHNICAL FIELD

The present invention relates in general to high temperature diffusion furnaces of the type used in semiconductor fabrication processes and, more particularly, to an exhaust port contamination trap for such furnaces for reducing contaminants within the process chamber.

BACKGROUND OF THE INVENTION

Horizontal processing furnaces have been widely used in the fabrication of semiconductor devices. In such furnaces, vapor is introduced at one end of a reactor tube and exhausted at an opposite end. Although a large amount of non-reacted particulate is typically deposited near the exhaust end of the reactor tube, this flaky deposition does not create a major problem in the horizontally oriented system.

For a variety of reasons, including conservation of floor space and increased control of process operations, the semiconductor industry has begun using vertical furnaces in place of horizontal furnaces. In a vertical reactor, process gas(es) (such as TEOS) is (are) typically introduced near the bottom of the reactor and exhausted near the top. As with a horizontally oriented furnace, significant particulate can accumulate near the exhaust end of the reactor, particularly with LPCVD processing where liquid source materials often result in exhaust by-products. However, should deposited by-product break loose in a vertically oriented furnace, the particulate would be pulled gravitationally downward to contaminate the semiconductor wafers (which are typically disposed directly beneath the exhaust port).

Thus, a challenge exists in the art to design an exhaust system for a vertically-oriented furnace which minimizes the likelihood of wafer contamination resulting from non-reacted particulate deposited in the vicinity of the exhaust port breaking free. The present invention addresses this challenge.

DISCLOSURE OF THE INVENTION

Briefly summarized, this invention comprises in one aspect a contaminant trap for a vertical furnace having a process chamber with an exhaust port near an upper end of the chamber through which by-products from the chamber are evacuated. The contaminant trap includes an enclosure having a lower portion and an upper portion which together substantially enclose an interior duct. An attachment mechanism secures the enclosure to the exhaust port of the chamber such that when attached, by-products from the process chamber may not be evacuated through the exhaust port around the enclosure. An input opening extends into the enclosure through which exhaust gases may pass from the process chamber into the interior duct of the enclosure, and an output opening in the enclosure allows gases within the interior duct of the enclosure to be evacuated. When the enclosure is attached to the exhaust port, the lower portion of the enclosure collects any particulate resulting from deposition of exhaust by-product within the interior duct of the enclosure, thereby preventing the particulate from becoming contaminant within the process chamber of the vertical furnace. In one embodiment, the enclosure comprises a housing having at least one sidewall, a solid bottom wall and a top wall that together define the interior duct.

In another aspect, the invention comprises a contaminant trap for a vertical furnace having a process chamber with an exhaust port near an upper end of the chamber through which exhaust by-products from the chamber may be evacuated. The trap includes a housing having a solid bottom wall and at least one sidewall. The housing is sized for disposition within the exhaust port of the process chamber such that a portion of the at least one sidewall and the bottom wall extend into the process chamber. The housing includes an interior compartment which is at least partially defined by the bottom wall and the at least one sidewall. An input opening extends through the at least one sidewall through which exhaust by-product may pass from the process chamber into the interior compartment of the housing. An attachment mechanism secures the housing to the exhaust port of the chamber such that when attached to the exhaust port, exhaust by-products in the process chamber may be evacuated therefrom through the housing. When attached to the exhaust port, the bottom wall of the housing collects particulate resulting from deposition of exhaust by-product within the interior compartment of the housing, thereby preventing the particulate from becoming contaminant within the process chamber of the vertical furnace.

A contaminant trap in accordance with the invention significantly reduces by-product deposition in the process chamber of a vertical furnace in the vicinity of the exhaust port. Because there is reduced particulate deposition within the chamber, the likelihood of particulate breaking loose and falling to contaminate wafers within the chamber is decreased. The contaminant trap is easy to fabricate and assemble, and requires little modification to existing vertical processing furnaces. Use of the trap results in a cleaner process at a lower operating cost.

BRIEF DESCRIPTION OF DRAWINGS

These and other objects, advantages and features of the present invention will be more readily understood from the following detailed description of certain preferred embodiments of the present invention, when considered in conjunction with the accompanying drawings in which:

FIG. 2 is a perspective view of one embodiment of a contaminant trap pursuant to the present invention for the vertical furnace of FIG. 1;

FIG. 4 is a partial cross-sectional elevation view of the contaminant trap of FIG. 2 shown operatively positioned within a more complete exhaust port of a vertical furnace.

BEST MODE FOR CARRYING OUT THE INVENTION

Refer now to the drawings wherein the same reference numbers are used throughout multiple figures to designate the same or similar components.

Figure 1:
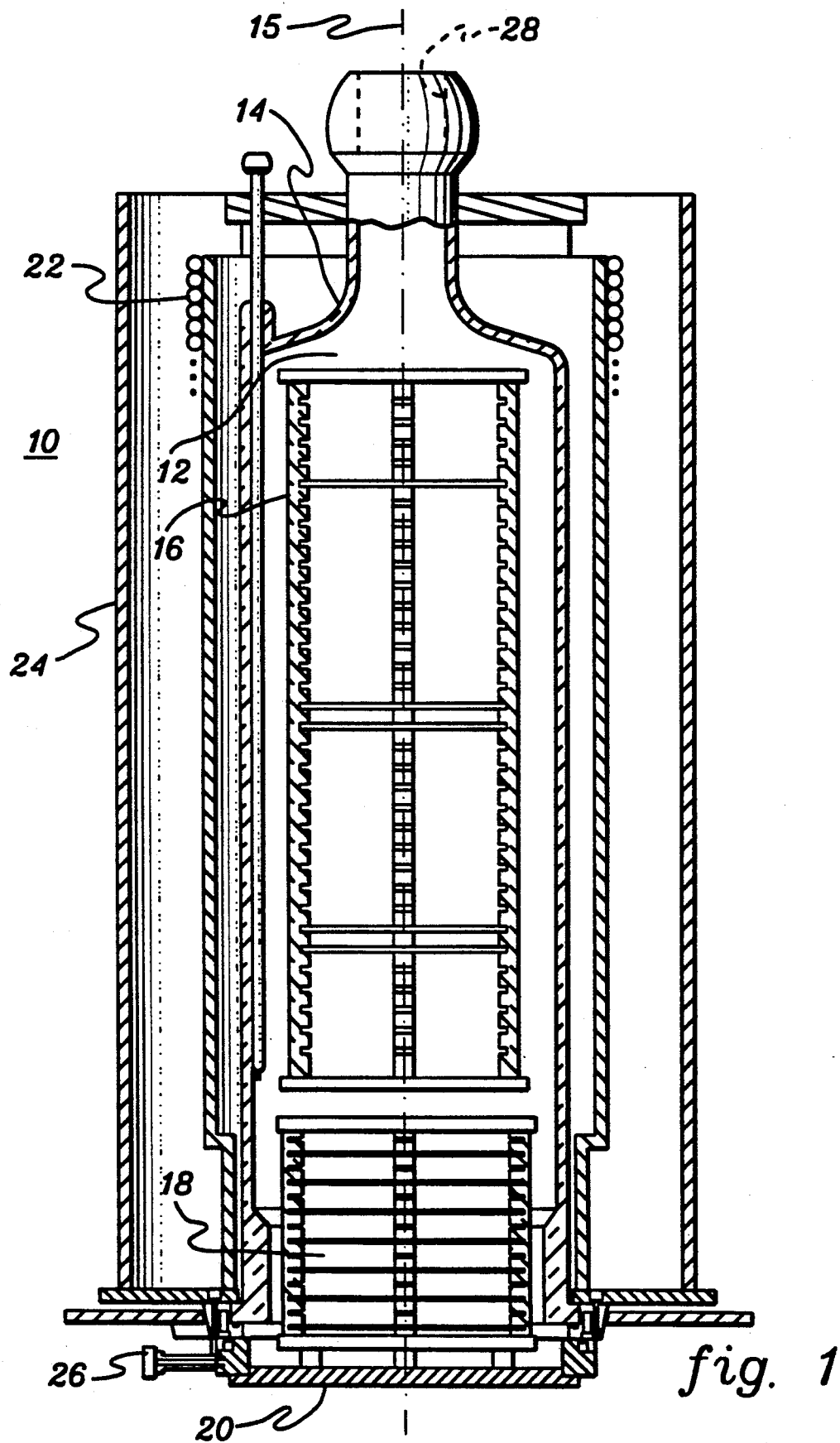
FIG. 1 is a schematic cross-sectional side elevation view of a vertical processing furnace to receive a contaminant trap in accordance with the present invention.

FIG. 1 represents a vertical processing furnace, generally denoted 10, of a type used in the semiconductor industry. Furnace 10 includes a process chamber 12 disposed inside an elongate inner shell 14 (fabricated of quartz). As described hereinafter and illustrated in FIG. 1, furnace 10 is designed so that the longitudinal axis 15 of inner shell 14 extends substantially vertically. Wafers to be subjected, for example, to a high temperature LPCVD treatment are supported in an elongate, quartz boat 16 sized to fit within process chamber 12. Boat 16 is supported on a quartz heat baffle or pedestal 18 that is attached to a door 20. Boat 16, baffle 18 and door 20 are typically moved as a unit along the longitudinal axis of the boat via an actuation assembly (not shown) attached to door 20.

Furnace 10 also includes a heating element 22 positioned between inner shell 14 and an outer shell 24. Heating element 22 (comprising, e.g., multiple heating coils) is designed to maintain process chamber 12 at a high temperature, such as in the range of 300°–1200° C. Process gases (e.g., TEOS) are introduced into chamber 12 via an inlet 26 positioned near the bottom of the chamber, and exhaust by-products (e.g., excess TEOS) are evacuated from the chamber at an exhaust port 28 near the top of the chamber. As described below, exhaust port 28 is tied to an exhaust cap (see FIG. 4).

Referring to FIG. 2, one embodiment of a contaminant trap, generally denoted 30, in accordance with the present invention is shown. Trap 30, for example manufactured of quartz, comprises a cylindrical-shaped enclosure (or housing) 32 having an upper end 34 and a lower end 36. An output opening 38 is positioned near upper end 34, while multiple input openings 40 are located adjacent to lower end 36. Within the enclosure 30 an interior duct (or compartment) 41 is defined. As described below, when the trap is positioned within a vertical furnace an encircling flange 42 is sized and configured to seat against the inner surface of exhaust port 28 (see FIG. 1) of process chamber 12.

Figure 3:
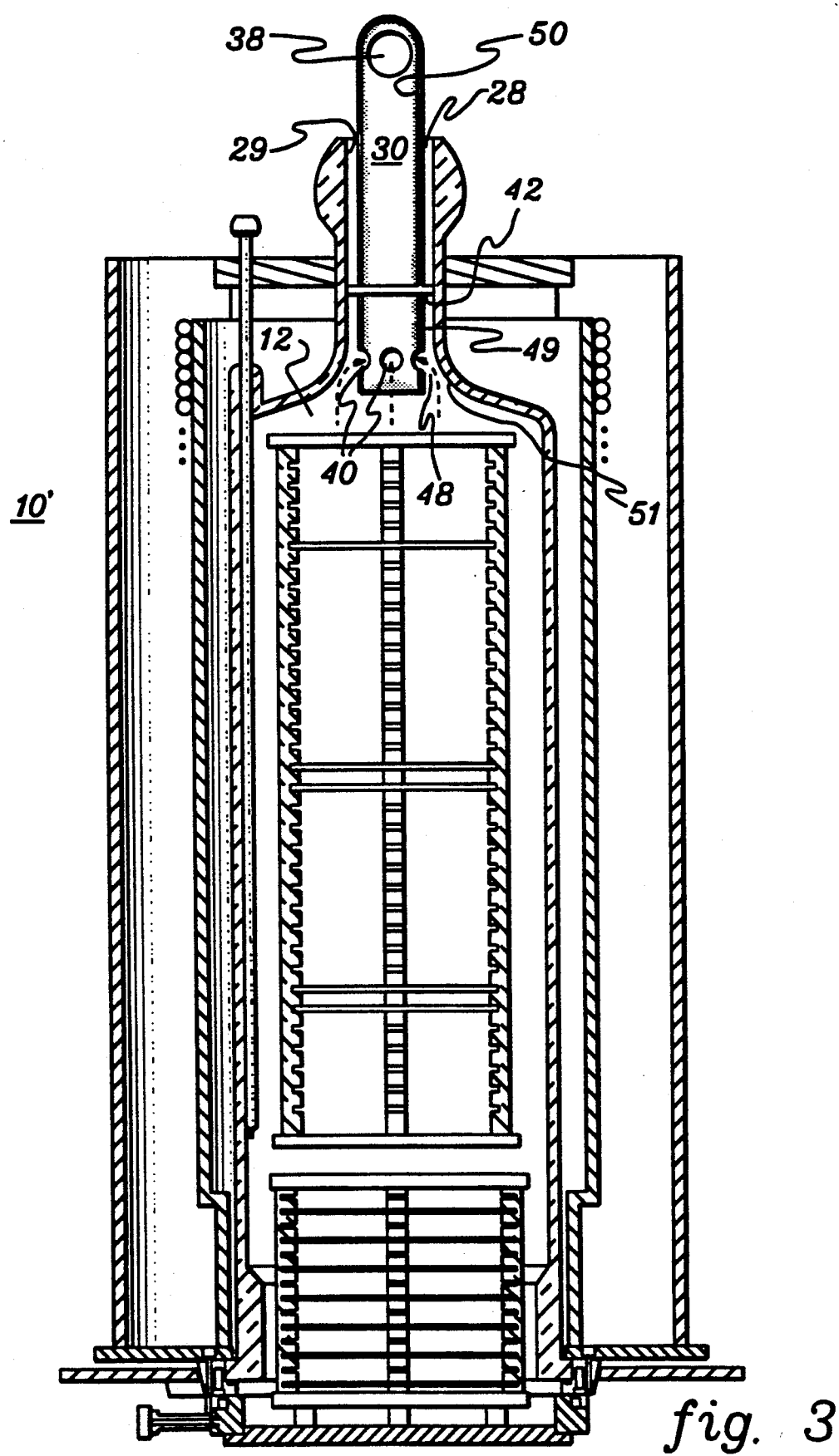
FIG. 3 is a schematic cross-sectional side elevation view of the vertical furnace of FIG. 1 with the contaminant trap of FIG. 2 shown in operative position therein.

Trap 30 is shown in operative position within a vertical processing furnace 10' in FIG. 3. As depicted, trap 30 resides substantially within the tubular neck portion of exhaust port 28 with flange 42 being seated against the inner sidewall 29 of port 28 such that exhaust by-products from the process chamber 12 may not evacuate through the exhaust port around trap 30. Rather, all exhaust by-products flow into input openings 40, through the interior duct (defined within the enclosure) for expulsion from output opening 38 of trap 30 near the top of the cylindrical-shaped enclosure.

When trap 30 is operatively positioned within vertical furnace 10', there exists a constricted gap 48 between the outer surface 49 of the trap 30 and the inner surface 51 of exhaust port 28 in the vicinity of input openings 40. This constricted gap 48 has a width much narrower than the standard inside diameter of the exhaust port's tubular neck. Because gap 48 is narrower, an elevated surface temperature is attained on the outer surface of the trap and the inner surface of the exhaust port, which in turn results in non-reacted vapor (e.g., TEOS) moving further downstream within the modified exhaust system before solidifying in the form of particulate. Solidification is delayed until the by-products reach the interior of the trap, and is depicted by particulates 50 on the interior surface of trap 30. A cleaner process is thus attained by moving the solidifying operation further downstream within the exhaust system. Further, should particulate on the interior surface of the trap break loose, the bottom wall of the trap will collect the particulate and prevent it from reaching the process chamber where it would otherwise become contaminant to the semiconductor process.

Contaminant trap 30 is shown in FIG. 4 positioned within a more detailed exhaust system for a vertical furnace. Specifically, a stainless steel exhaust cap 60 is fitted over exhaust port 28 of the furnace and, as shown, the contaminant trap eliminates any line-of-sight path between the process chamber and exhaust cap 60, thereby further reducing the possibility of particulate deposited downstream returning to the process chamber as contaminant. (Conventionally, a large amount of by-products are deposited on the exhaust cap 60 directly over the process chamber.) Trap 30 diverts exhaust by-product flow from an area directly over the chamber down the exhaust line so there is a reduced amount of deposit that can potentially contaminate the chamber.

It will be understood from the above discussion that a contaminant trap in accordance with the present invention significantly reduces particulate deposition in the process chamber of a vertical furnace. Because there is reduced particulate deposition within the chamber, the likelihood of particulate breaking loose and falling to contaminate wafers undergoing processing is decreased. The contaminant trap is easy to fabricate and assemble, and requires little modification to existing vertical processing furnaces. Use of the trap results in a cleaner process at a lower operating cost.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the scope of the invention. The following claims are intended to encompass all such modifications.

We claim:

1. A contaminant trap for a vertical furnace having a process chamber with an exhaust port near an upper end of the chamber through which exhaust by-products from the process chamber may be evacuated, said contaminant trap comprising:
   an enclosure having a lower portion and an upper portion that together define an interior duct;
   means for attaching said enclosure to said exhaust port of said chamber such that when attached to said exhaust port, exhaust by-products in the process chamber may not be evacuated through said exhaust port around said enclosure;
   said enclosure having an input opening extending therein through which exhaust by-products may pass from said process chamber into said interior duct;
   said enclosure also having an output opening through which exhaust by-products in said interior duct may be evacuated; and
   wherein when said enclosure is attached to said exhaust port, said lower portion of said enclosure collects particulate resulting from deposition of exhaust by-products within said interior duct of said enclosure, thereby preventing said particulate from becoming contaminant within the process chamber of the vertical furnace.

2. The contaminant trap of claim 1, wherein said input opening extending into said enclosure is disposed within said lower portion of said enclosure and said output opening in said enclosure is disposed within said upper portion of said enclosure.

3. The contaminant trap of claim 1, wherein said input opening comprises multiple input openings extending into said enclosure in said lower portion of said enclosure.

4. The contaminant trap of claim 1, wherein said lower portion of said enclosure includes a solid bottom wall designed to collect particulate resulting from exhaust by-products within the interior duct of the enclosure.

5. The contaminant trap of claim 1, wherein said enclosure is cylindrical-shaped and wherein said means for attaching said enclosure to said exhaust port of said chamber includes a flange encircling said cylindrical-shaped enclosure, said flange being sized to engage an inner wall of said exhaust port such that exhaust by-products may not be evacuated through said exhaust port around said enclosure.

6. The contaminant trap of claim 1, wherein said vertical furnace comprises a high temperature LPCVD furnace.

7. The contaminant trap of claim 1, wherein said exhaust port of said process chamber includes an exhaust cap and wherein when said enclosure is attached to said exhaust port of said chamber, said upper portion of said enclosure extends into said exhaust cap of said exhaust port, said upper portion of said enclosure extending into said exhaust cap including said output opening of said enclosure.

8. The contaminant trap of claim 1, wherein said exhaust port has an inner surface with a tubular configuration definitive of an inner diameter, and wherein when said enclosure is attached to said exhaust port, a gap is defined between an outer surface of said enclosure and said inner surface of said exhaust port, said gap having a width smaller than the inner diameter of said exhaust port such that surface temperature of the inner surface of the exhaust port is higher than without said enclosure, thereby reducing deposition of exhaust by-products thereon.

9. A contaminant trap for a vertical furnace having a process chamber with an exhaust port near an upper end of the chamber through which exhaust by-products from the process chamber may be evacuated, said contaminant trap comprising:
    a housing having a solid bottom wall and at least one sidewall, said housing being sized for disposition within said exhaust port of said process chamber such that a portion of said at least one sidewall and said bottom wall extend into said process chamber, said housing having an interior compartment at least partially defined by said bottom wall and at least one sidewall;
    said at least one sidewall of said housing including an input opening extending therein through which exhaust by-products may pass from said process chamber into said interior compartment;
    means for attaching said housing to said exhaust port of said chamber such that when attached to said exhaust port, exhaust by-products in the process chamber may be evacuated therefrom through said input opening in said at least one sidewall of said housing; and
    wherein when said housing is attached to said exhaust port, said bottom wall of said housing collects particulate resulting from deposition of said exhaust by-product within the interior compartment of the housing, thereby preventing said particulate from becoming contaminant within the process chamber of the vertical furnace.

10. The contaminant trap of claim 9, wherein said vertical furnace comprises a high temperature LPCVD furnace.

11. The contaminant trap of claim 9, wherein said means for attaching said housing to said exhaust port includes a flange encircling said at least one sidewall, said flange being sized and configured to engage an inner wall of said exhaust port such that exhaust by-products may not be evacuated through said exhaust port around said housing.

12. The contaminant trap of claim 9, wherein said at least one sidewall of said housing includes multiple openings extending therein through which exhaust by-products may pass from said process chamber into said interior compartment.

13. A contaminant trap for a vertical furnace having a process chamber With an exhaust port near an upper end of the chamber through which exhaust by-products from the process chamber may be evacuated, said contaminant trap comprising:
    a housing having at least one sidewall, a bottom wall and a top wall that together define an interior compartment;
    attachment means for attaching said housing to said exhaust port of said chamber such that when attached to said exhaust port, exhaust by-products in the process chamber may not be evacuated through the exhaust port around the housing;
    said enclosure having at least one input opening in said at least one sidewall through which exhaust by-products may pass from said process chamber into said interior compartment of said housing;
    said enclosure also having an output opening extending through one of said at least one sidewall and said top wall through which exhaust by-products within said interior compartment of said housing may be removed; and
    wherein when said housing is attached to said exhaust port, said bottom wall of said housing collects particulate resulting from deposition of exhaust by-products within said interior compartment of said housing, thereby preventing said particulate from becoming contaminant within the process chamber of the vertical furnace.

14. The contaminant trap of claim 13, wherein said bottom wall of said housing is solid.

15. The contaminant trap of claim 13, wherein said attachment means includes a flange encircling said housing, said flange being sized and configured to engage an inner wall of said exhaust port such that exhaust by-products may not be evacuated through said exhaust port around said housing.

16. The contaminant trap of claim 13, wherein said vertical furnace comprises a high temperature LPCVD furnace.

17. The contaminant trap of claim 13, wherein said exhaust port of said process chamber includes an exhaust cap and when said housing is attached to said exhaust port of said chamber, said top wall of said housing extends into said exhaust cap of said exhaust port.

18. The contaminant trap of claim 13, wherein said exhaust port has an inner surface with a tubular configuration definitive of an inner diameter, and wherein when said housing is attached to said exhaust port, a gap is defined between an outer surface of said housing and said inner surface of said exhaust port, said gap having a width smaller than the inner diameter of the exhaust port such that surface temperature of the inner surface of the exhaust port in the vicinity of the housing is higher than without said housing, thereby reducing deposition of exhaust by-products thereon.

19. The contaminant trap of claim 13, wherein said housing is fabricated of quartz.

20. Apparatus for processing semiconductor wafers, said apparatus comprising:
- a vertical furnace having a process chamber with an exhaust port near an upper end of the chamber through which exhaust by-products from the process chamber may be evacuated; and
- a contaminant trap for the vertical furnace, said contaminant trap including
  (i) a housing having a solid bottom wall and at least one sidewall, said housing being sized for disposition within said exhaust port of said process chamber such that a portion of said at least one sidewall and said bottom wall extend into said process chamber, said housing having an interior compartment at least partially defined by said bottom wall and at least one sidewall,
  (ii) said at least one sidewall of said housing including an input opening extending therein through which exhaust by-products may pass from said process chamber into said interior compartment,
  (iii) means for attaching said housing to said exhaust port of said chamber such that when attached to said exhaust port, exhaust by-products in the process chamber may be evacuated therefrom through said input opening in said at least one sidewall of said housing,
  (iv) wherein when said housing is attached to said exhaust port, said bottom wall of said housing collects particulate resulting from deposition of said exhaust by-product within the interior compartment of the housing, thereby preventing said particulate from becoming contaminant within the process chamber of the vertical furnace.

* * * * *